(12) United States Patent
Morita et al.

(10) Patent No.: US 12,449,737 B2
(45) Date of Patent: *Oct. 21, 2025

(54) PATTERN FORMING METHOD, RESIST MATERIAL, AND PATTERN FORMING APPARATUS

(71) Applicant: Oji Holdings Corporation, Tokyo (JP)

(72) Inventors: Kazuyo Morita, Tokyo (JP); Kimiko Hattori, Tokyo (JP)

(73) Assignee: Oji Holdings Corporation, Tokyo (JP)

( * ) Notice: Subject to any disclaimer, the term of this patent is extended or adjusted under 35 U.S.C. 154(b) by 677 days.

This patent is subject to a terminal disclaimer.

(21) Appl. No.: 17/623,979

(22) PCT Filed: Jun. 30, 2020

(86) PCT No.: PCT/JP2020/025633
§ 371 (c)(1),
(2) Date: Dec. 30, 2021

(87) PCT Pub. No.: WO2021/002351
PCT Pub. Date: Jan. 7, 2021

(65) Prior Publication Data
US 2022/0365448 A1    Nov. 17, 2022

(30) Foreign Application Priority Data

Jul. 2, 2019   (JP) .............................. 2019-123880

(51) Int. Cl.
*G03F 7/004*   (2006.01)
*G03F 7/00*    (2006.01)
*G03F 7/012*   (2006.01)
*G03F 7/039*   (2006.01)

(52) U.S. Cl.
CPC ........ *G03F 7/70625* (2013.01); *G03F 7/0045* (2013.01); *G03F 7/0125* (2013.01); *G03F 7/0397* (2013.01); *G03F 7/70125* (2013.01)

(58) Field of Classification Search
CPC .... G03F 7/0044; G03F 7/0397; G03F 7/0042; G03F 7/0043
See application file for complete search history.

(56) References Cited

U.S. PATENT DOCUMENTS

| | | | |
|---|---|---|---|
| 4,981,770 A | 1/1991 | Taylor | |
| 11,217,431 B2 | 1/2022 | Saito et al. | |
| 12,248,249 B2 * | 3/2025 | Hattori | G03F 7/265 |
| 2017/0066890 A1 | 3/2017 | Oser et al. | |
| 2020/0133131 A1 * | 4/2020 | Ouyang | G03F 7/168 |
| 2021/0149307 A1 * | 5/2021 | Hattori | G03F 7/094 |

FOREIGN PATENT DOCUMENTS

| | | |
|---|---|---|
| CN | 106062093 A | 10/2016 |
| JP | S63-137227 A | 6/1988 |
| JP | 2012-113303 A | 6/2012 |
| JP | 2013-145255 A | 7/2013 |
| JP | 2019-500490 A | 1/2019 |
| JP | 2019-53228 A | 4/2019 |
| JP | 2019054062 A | 4/2019 |
| TW | 201241555 A1 | 10/2012 |
| TW | 201406984 A | 2/2014 |
| TW | 201530254 A | 8/2015 |
| TW | 201708573 A | 3/2017 |
| TW | 201816163 A | 5/2018 |
| TW | 201908350 A | 3/2019 |
| WO | 2016/130548 A1 | 8/2016 |
| WO | 2017/066319 A2 | 4/2017 |
| WO | 2017/066319 A3 | 4/2017 |
| WO | 2017/066319 A8 | 4/2017 |
| WO | 2019/012716 A1 | 1/2019 |
| WO | 2019/098208 A1 | 5/2019 |

OTHER PUBLICATIONS

Taiwanese office action dated Oct. 30, 2023, from corresponding Taiwanese patent application No. 109122189.
Japanese official action dated Jun. 18, 2024 issued in the corresponding Japanese patent application No. 2021-530032.
Taiwanese official action dated May 15, 2024 issued in the corresponding Taiwanese patent application No. 109122189.
International Search Report and Written Opinion issued in PCT/JP2020/025633, mailed Aug. 18, 2020,.
Japanese version of International Preliminary Report on Patentability of Chapter I issued in PCT/JP2020/025633, mailed Jan. 13, 2022, with English translation.
Office Action dated Oct. 22, 2024 issued in the corresponding Japanese patent application No. 2021-530032 with its English Machine Translation.
Office Action dated Nov. 26, 2024 issued in the corresponding Korean patent application No. 10-2022-7001581 with its English Machine Translation.
Office Action dated Apr. 24, 2025 issued in the corresponding Taiwanese patent application No. 109122189 with its English Translation.
Office Action dated Apr. 25, 2025 issued in the corresponding Taiwanese patent application No. 113130092 with its English Translation.

(Continued)

*Primary Examiner* — Daborah Chacko-Davis

(74) *Attorney, Agent, or Firm* — Troutman Pepper Locke LLP

(57) ABSTRACT

It is an object of the present invention to provide a method of forming a high-contrast fine pattern onto a resist film. The present invention relates to a pattern forming method, comprising; applying a resist material onto a substrate to form a resist film, introducing a metal into the resist film, exposing, and developing. In addition, the present invention also relates to a resist material and a pattern forming apparatus.

13 Claims, 1 Drawing Sheet

(56) References Cited

OTHER PUBLICATIONS

Office Action issued in corresponding Korean Patent Application No. KR 10-2022-7001581, mailed Jul. 18, 2025, with English translation.

* cited by examiner (a)
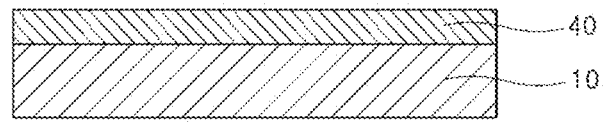
(b)
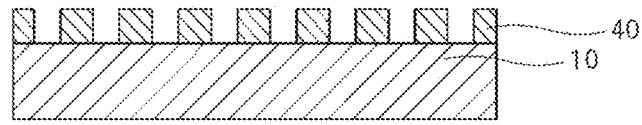
(c)
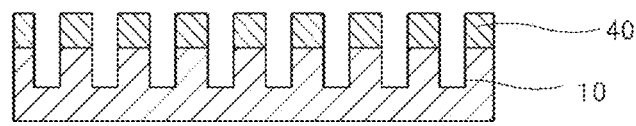

PATTERN FORMING METHOD, RESIST MATERIAL, AND PATTERN FORMING APPARATUS

TECHNICAL FIELD

The present invention relates to a pattern forming method, a resist material, and a pattern forming apparatus.

BACKGROUND ART

Electronic devices such as semiconductors are required to be highly integrated due to miniaturization. Regarding the patterns of semiconductor devices. For example, a lithography method using a photoresist is a processing method in which a photoresist pattern is obtained by forming a photoresist thin film is formed on a semiconductor substrate such as a silicon wafer, irradiating an actinic ray such as an ultraviolet ray through a mask pattern on which a pattern of a semiconductor device is drawn, and performing development, and then, fine irregularities corresponding to the pattern are formed on the substrate by etching the substrate with the obtained photoresist pattern as a protective film.

For example, Patent Document 1 discloses a method of forming a pattern, which comprises spin-coating a solution containing an α-methylstyrene-α-chloroacrylic acid ester copolymer onto a substrate, then pre-baking the substrate, and then exposing the substrate to an electron beam, followed by performing a development treatment. Moreover, Patent Document 2 discloses a method for forming a coating capable of forming a pattern with radioactive rays. Specifically, Patent Document 2 discloses a method for forming a coating, which comprises a step of accumulating on a substrate, a coating solution containing an organic solvent, a first organic metal composition, and a metal compound having a hydrolysable ligand-metal bond, and further, exposing a precursor coating on the substrate to water.

Patent Document 3 discloses a pattern forming method, comprising a film-forming step and a contact step of allowing a pattern-forming material film to come into contact with a metal compound containing a metallic element. Herein, the film-forming step comprises a step of forming a film containing a pattern-forming material, a step of applying an electromagnetic wave to a first region of the film, and a step of removing the first region, and after completion of these steps, a contact step of allowing the film to come into contact with a metal compound containing a metallic element is established.

PRIOR ART DOCUMENTS

Patent Documents

Patent Document 1: JP Patent Publication-A-63-137227 (1988)
Patent Document 2: JP Patent Publication-A-2019-500490
Patent Document 3: JP Patent Publication-A-2019-53228

SUMMARY OF INVENTION

Object to be Solved by the Invention

As described above, in a lithographic method using a photoresist, a method for forming a fine pattern has been studied. However, in the conventional pattern forming method, there is a case where the contrast is low after the formation of a pattern of a resist material, and thus, it has been desired to improve this low contrast.

Hence, in order to solve the aforementioned problem of the prior art technique, the present inventors have conducted studies for the purpose of providing a method of forming a high-contrast fine pattern on a resist film.

Means for Solving the Object

As a result of intensive studies conducted directed towards achieving the aforementioned object, the present inventors have found that the contrast of a resist film can be enhanced by establishing a step of introducing a metal into the resist film between a step of applying a resist material onto a substrate to form the resist film and an exposure step, thereby completing the present invention.

Specifically, the present invention has the following configurations.

[1] A pattern forming method, comprising:
applying a resist material onto a substrate to form a resist film,
introducing a metal into the resist film,
exposing, and
developing.

[2] The pattern forming method according to [1], wherein the resist material comprises a polymer, and the polymer comprises a unit derived from at least one selected from structures represented by the following formulae (101) to (103):

[Formula 1]

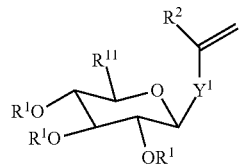

Formula (101)

[Formula 2]

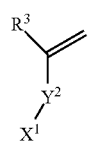

Formula (102)

[Formula 3]

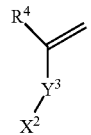

Formula (103)

wherein, in the formula (101), $R^1$ each independently represents a hydrogen atom, an alkyl group optionally having a substituent, an acyl group optionally having a substituent, an allyl group optionally having a substituent, an alkoxy group optionally having a substituent, or an alkylsilyl group optionally having a substituent, and a plurality of $R^1$ may be the same or different; $R^{11}$ represents a hydrogen atom or an alkyl group optionally having a substituent; $R^2$ represents a hydrogen atom, an alkyl group, a fluorine atom, a chlorine atom, a bromine atom, or a halogenated alkyl group; and $Y^1$ represents a single bond or a linking group;

in the formula (102), $X^1$ represents an alkyl group optionally having a substituent, an acyl group optionally having a substituent, or an allyl group optionally having a substituent: $R^3$ represents a hydrogen atom, an alkyl group, a fluorine atom, a chlorine atom, a bromine atom, or a halogenated alkyl group; and $Y^2$ represents a single bond or a linking group; and in the formula (103), $X^2$ represents an aryl group optionally having a substituent; $R^4$ represents a hydrogen atom, an alkyl group, a fluorine atom, a chlorine atom, a bromine atom, or a halogenated alkyl group; and $Y^3$ represents a single bond or a linking group.

[3] The pattern forming method according to [2], wherein the polymer comprises the units derived from the structures represented by the formulae (101) to (103).

[4] The pattern forming method according to [3], wherein at least any one of the $R^2$ to $R^4$ is a fluorine atom, a chlorine atom, or a bromine atom.

[5] The pattern forming method according to any one of [1] to [4], wherein the metal introduction step is a step of introducing at least one selected from the group consisting of Mg, Al, Ag, Ge, Cd, W, Ta. Hf. Zr, Mo, In, Sn, Sb, and Te into the resist film.

[6] The pattern forming method according to any one of [1] to [5], wherein, in the introducing a metal into the resist film, a metal material, in which at least one selected from halogen, an alkyl group, and an aminoalkyl group binds to a metallic element, is used.

[7] A metal gas material used in the pattern forming method according to any one of [1] to [6], wherein the metal gas material comprises at least one selected from the group consisting of Mg, Al, Ag, Ge. Cd, W, Ta, Hf, Zr, Mo, In, Sn, Sb, and Te.

[8] The metal gas material according to [7], which is a material in which at least one selected from halogen, an alkyl group, and an aminoalkyl group binds to a metallic element.

[9] A resist material that comprises a polymer comprising a unit derived from at least one selected from structures represented by the following formulae (101) to (103), wherein the resist material is for use in introduction of a metal:

[Formula 4]

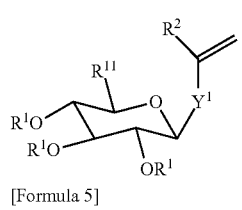

Formula (101)

[Formula 5]

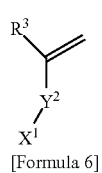

Formula (102)

[Formula 6]

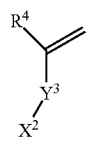

Formula (103)

wherein, in the formula (101), $R^1$ each independently represents a hydrogen atom, an alkyl group optionally having a substituent, an acyl group optionally having a substituent, an allyl group optionally having a substituent, an alkoxy group optionally having a substituent, or an alkylsilyl group optionally having a substituent, and a plurality of $R^1$ may be the same or different; $R^{11}$ represents a hydrogen atom or an alkyl group optionally having a substituent; $R^2$ represents a hydrogen atom, an alkyl group, a fluorine atom, a chlorine atom, a bromine atom, or a halogenated alkyl group; and $Y^1$ represents a single bond or a linking group;

in the formula (102), $X^1$ represents an alkyl group optionally having a substituent, an acyl group optionally having a substituent, or an allyl group optionally having a substituent: $R^3$ represents a hydrogen atom, an alkyl group, a fluorine atom, a chlorine atom, a bromine atom, or a halogenated alkyl group; and $Y^2$ represents a single bond or a linking group; and in the formula (103), $X^2$ represents an aryl group optionally having a substituent; $R^4$ represents a hydrogen atom, an alkyl group, a fluorine atom, a chlorine atom, a bromine atom, or a halogenated alkyl group; and $Y^3$ represents a single bond or a linking group.

[10] The resist material according to [9], wherein the polymer comprises the units derived from the structures represented by the formulae (101) to (103).

[11] The resist material according to [10], wherein at least any one of the $R^2$ to $R^4$ is a fluorine atom, a chlorine atom, or a bromine atom.

[12] A pattern forming apparatus comprising:
an applier which apply a resist material onto a substrate to form a resist film,
an introducer which introduce a metal into the resist film,
an exposure, and
a developer.

Advantageous Effects of Invention

According to the production method of the present invention, a high-contrast fine pattern can be formed on a resist film.

BRIEF DESCRIPTION OF DRAWINGS

FIG. 1 is a cross-sectional view for illustrating an example of a structure composed of a substrate and a resist film.

EMBODIMENTS OF CARRYING OUT THE INVENTION

The present invention is described in detail herein under. The description of the constitutive elements of the invention given herein under is for some typical embodiments and examples of the invention, but the invention should not be limited to such embodiments. In this description, the numerical range expressed by the wording "a number to another number" means the range that falls between the former number indicating the lower limit value of the range and the latter number indicating the upper limit value thereof.

Pattern Forming Method

The present invention relates to a pattern forming method, comprising a step of applying a resist material onto a substrate to form a resist film, a step of introducing a metal into the resist film, an exposure step, and a development step. The pattern forming method of the present invention comprises a step of forming a resist film, a step of introducing a metal into the resist film, an exposure step, and a development step in this order.

FIG. 1(a) shows a laminate, in which a resist material is applied onto a substrate 10 to form a resist film 40. Besides, although it is not shown in the figure, another layer may be established between the substrate 10 and the resist film 40. In the state of a laminate in which the resist film 40 is formed on the substrate 10, a metal is introduced into the resist film 40. Thereafter, as shown in FIG. 1(b), at least a portion of the resist film 40 is removed, so that a desired pattern shape can be formed on the substrate 10. For example, exposure and development treatments are performed on the resist film 40, so that a pattern shape as shown in FIG. 1(b) can be formed.

The pattern forming method of the present invention comprises a step of introducing a metal into a resist film, between a step of forming the resist film and an exposure step. Thus, according to the present invention, by establishing a step of introducing a metal into a resist film between a step of forming the resist film and an exposure step, a high-contrast resist film can be formed. With regard to the contrast of the resist film, a difference between resist pattern heights before and after the development is measured, and when the value obtained by subtracting the height of the resist film after the development from the height of the resist film before the development is small, the contrast can be evaluated to be high. Specifically, when a change in the resist heights before and after the development is small, the resist film can be evaluated to have a high contrast.

Moreover, according to the pattern forming method of the present invention, the resolution of the resist film can also be enhanced. When a resist film is formed and a line-and-space pattern with a width of 100 nm is then formed thereon, if a desired pattern structure is formed and there is no residue derived from the resist film in the space portion, the resolution can be evaluated to be favorable.

Furthermore, according to the pattern forming method of the present invention, a pattern having a high aspect ratio can be formed on the resist film. The aspect ratio of the resist film is a value calculated according to the expression: the height of the resist film/the width of the resist film, in the line portion of a line-and-space pattern formed on the resist film. In the present description, a pattern shape is observed in a state in which a theoretical aspect value can be achieved, and when the pattern is linear, the aspect ratio can be evaluated to be high.

Besides, in the pattern forming method of the present invention, the resist material used to form the resist film does not contain a metal component, and after the formation of the resist film, a metal is introduced into the resist film. Thereby, the stability of the resist material can be further enhanced. Moreover, in the pattern forming method of the present invention, a metal is introduced into the resist film, in a stage before the formation of a pattern shape on the resist film, a metal is introduced. Thereby, the contrast of patterning in the resist film can be more effectively enhanced.

Step of Forming Resist Film

Examples of the substrate used in the pattern forming method may include substrates made of glass, silicon, SiN, GaN, AlN, etc. Otherwise, a substrate consisting of an organic material such as PET, PE, PEO, PS, a cycloolefin polymer, polylactic acid, or a cellulose nanofiber may also be used.

Before application of the resist material onto the substrate, a step of washing the substrate is preferably established. By washing the surface of the substrate, the coatability of the resist material is improved. As a washing method, a conventionally known method can be utilized, and examples of the known method may include an oxygen plasma treatment, an ozone oxidation treatment, an acid alkali treatment, and a chemical modification treatment.

The method of applying the resist material onto the substrate is not particularly limited, and for example, according to a known method such as a spin-coating method, the resist material can be applied onto the substrate. For example, a spin method, a spray method, a method of using a dispenser to coat a region to be coated all at once, an ink-jet method, etc. can be adopted. Among these methods, the method of applying the resist material onto the substrate is preferably a spin method.

After application of the resist material onto the substrate, heating may be performed to harden the resist material, so as to form a resist film. In particular, when the resist material is applied onto the substrate according to a spin-coating method, a solvent comprised in the resist material can be removed in a short time by establishing such a heating step. The temperature applied upon heating the coated film is not particularly limited, and it is preferably 60° C. or higher and 550° C. or lower. In addition, the heating treatment is preferably carried out under the ambient atmosphere and at a relatively low temperature. The heating method is not particularly limited, and a method using a hot plate, a method of applying infrared radiation, etc. can be adopted. Among others, a method using a hot plate is preferable because it is simple. Moreover, the atmosphere applied upon the heating can be set to be under the ambient atmosphere, or under inert gas such as nitrogen, or under vacuum, or the like. The heating time is not particularly limited, and it is preferably 0.3 minutes or more and 10 minutes or less.

The substrate and the resist film are preferably laminated in this order, such that the adjacent layers are allowed to directly come into contact with each other. However, another layer may be established between individual layers. For example, an anchor layer may be established between the substrate and the resist film. The anchor layer is a layer that controls the wettability of the substrate and enhances the adhesiveness between the substrate and the resist film. In addition, an antireflective film may be established between the substrate and the resist film. Besides, a plurality of layers consisting of different materials may be sandwiched between the substrate and the resist film. These materials are not particularly specified, and examples of the materials may include inorganic materials such as $SiO_2$, SiN, $Al_2O_3$, AlN, GaN, GaAs, W, Cr, Ru, Ta, TaN, SOG or amorphous carbon, and organic materials such as commercially available SOC or adhesives.

Metal Introduction Step

The pattern forming method of the present invention may further comprise a metal introduction step between the step of forming a resist film and the exposure step. In this case, the metal introduction step may be a step of introducing a metal into a resist film, such as an SIS method (Sequential Infiltration Synthesis). Examples of the metal to be introduced into the resist film may include Li, Be, Na, Mg, Al, Si, K, Ca, Sc, Ti, V, Cr, Mn, Fe, Co, Ni, Cu, Zn, Ga. Ge, As, Rb, Sr, Y. Zr, Nb, Mo, Ru, Pd, Ag, Cd, In, Sn, Sb, Te, Cs, Ba, La, Hf, Ta, W, Re, Os, Ir, Pt, Au, Hg, Tl, Pb, Bi, Po, Ce, Pr, Nd, Pm, Sm. Eu, Gd, Tb, Dy. Ho, Er, Tm, Yb, and Lu. Among others, the metal to be introduced is preferably at least one selected from the group consisting of Mg, Al, Ag, Ge, Cd. W, Ta, Hf, Zr, Mo, In, Sn, Sb, and Te, and is more preferably at least one selected from the group consisting of Sn, Sb and Te. Such a process can be carried out according the method described, for example, in Journal of Photopolymer Science and Technology, Volume 29, Number 5 (2016) 653-657.

In the metal introduction step, it is preferable to adopt a method of allowing a metal gas to permeate into the resist film so as to introduce the metal gas therein, a method of injecting metal ions into the resist film according to an ion implantation technique so as to introduce the metal ions therein, or a method of applying a solution containing a metal onto the resist film so that the metal is allowed to react with the material. Among others, the method of allowing a metal gas to permeate into the resist film is particularly preferable because the metal easily permeates into the resist film and also, the component contained in the resist film forms a bond with the metal according to a chemical reaction.

According to the method of allowing a metal gas to permeate into the resist film, it is preferable that a substrate on which a resist film has been formed is placed in a vacuum chamber, vacuum conditions are then created, and the vacuum chamber is then filled with a metal gas. The vacuum chamber is preferably filled with a metal gas for a certain period of time. After completion of the reaction, the inside of the vacuum chamber is returned to ordinary pressure, and the substrate on which the resist film has been formed is taken out. Besides, after introduction of a metal gas into the resist film, water vapor, ozone, or the like may be allowed to come into contact with the resist film. In addition, the above-described step is defined as a single cycle, and the step of allowing a metal gas to permeate into the resist may be carried out for 1 to 100 cycles. If the step of allowing a metal gas to permeate into the resist is carried out at a time, the processing time can be favorably reduced. On the other hand, by repeating the step of allowing a metal gas to permeate into the resist several times, a larger amount of metal can be favorably introduced into the resist film.

As a post step of the metal introduction step, a heating step may be established. By heating, permeation of the metal into the resist film can be promoted. The heating method is not particularly limited, and a hot plate, irradiation with laser such as infrared ray, xenon flash lamp irradiation, and the like can be applied.

As a metal gas used in the metal introduction step, for example, a metal gas, in which halogen, an alkoxy group, an alkyl group, or an aminoalkyl group binds to a metallic element, can be used. Examples of the metal gas may include magnesium chloride, aluminum chloride, silver chloride, germanium chloride, cadmium chloride, tungsten chloride, tantalum chloride, hafnium chloride, indium chloride, tin chloride, antimony chloride, tellurium chloride, molybdenum chloride, tetrakis(dimethylamino)hafnium, tetramethoxy hafnium, trimethyl aluminum, bis(diisopropylpropion amidinate)-cobalt, diisopropylpropion amidinate-copper, tetratri(dimethylamino)titanium, dimethyltellurium, diethyltellurium, di(isopropyl)tellurium, di(isopropyl)ditellurium, tri(isopropyl)antimony, tetramethyltin, tetrakis(dimethylamino)tin, tri(isobutyl)indium, tri(isobutyl)gallium, pentakis(dimethylamino)tantalum, bis(acetylacetonato) magnesium, tetraethoxy germanium, tetraethyl germanium, tetramethoxy germanium, dimethyl cadmium, tetraisoproxy zirconium, tetrakis(dimethylamide)zirconium, bis(methylcyclopentadienylmethoxymethyl)zirconium, bis(methylcyclopentadienyldimethyl)hafnium, bis(t-butylimino)bis(dimethylamino)molybdenum, and bis(t-butylimino)bis (dimethylamino)tungsten. Among others, a metal gas, in which at least one selected from halogen, an alkyl group, and an aminoalkyl group binds to a metallic element, is preferable because it is highly reactive. Even though such a metal gas is a liquid or a solid at ordinary temperature, it can be applied by using the vapor thereof. In order to generate such vapor, the metal gas material can also be heated.

Besides, the present invention may relate to a metal gas material used in the metal introduction step in the pattern forming method, wherein the metal gas material comprises at least one selected from the group consisting of Mg, Al, Ag, Ge, Cd, W, Ta, Hf, Zr, Mo, In, Sn, Sb, and Te. Such a metal gas material is particularly preferably a material, in which at least one selected from halogen, an alkyl group, and an aminoalkyl group binds to a metallic element.

The metal solution used in the metal introduction step is not particularly limited. Examples of the metal solution may include a ferrocene solution, a tellurium tetrachloride solution, a tin acetate solution, a copper acetylacetonate solution, an indium iodide solution, a hexaamminecobalt chloride solution, a zirconium ethylenediamine tetraacetate solution, and a copper ethylenediamine tetraacetate solution. The solvent used in the metal solution is not particularly limited, and water, an organic solvent, or the like can be used. Among others, the solvent is preferably ethanol, isopropyl alcohol, acetonitrile, ethyl acetate, or the like.

In the metal introduction step, when a metal gas is introduced, the temperature of the substrate is preferably 0° C. to 400° C., and more preferably 20° C. to 300° C. In addition, in order to facilitate permeation of the gas, the pressure in the chamber is preferably 100 kPa or less upon introduction of the metal gas. Moreover, upon introduction of the metal gas, the inside of the chamber can be irradiated with plasma. By irradiating with plasma, it becomes possible to further activate the metal gas. For example, as disclosed in JP Patent Publication-A-2019-54062 A, a method of introducing a metal gas while performing plasma irradiation using an argon gas can also be applied.

Exposure Step

The exposure step is a step of applying an electromagnetic wave to the metal-introduced resist film in order to form any given pattern. The electromagnetic wave is not particularly limited, and a semiconductor laser, a high-pressure mercury lamp such as a g-line or an i-line, an excimer laser such as ArF or KrF, an electron beam, an extreme ultraviolet, an X-ray, etc. can be used. In particular, when an electron beam or an extreme ultraviolet is used, a reduction in the thickness of the resist film can be decreased by using the method of the present invention. Furthermore, the effect of introducing a metal can also provide the effect of facilitating the inspection of a fine pattern structure. After completion of the exposure, post exposure baking can also be carried out, as necessary. The post exposure baking is preferably carried out under conditions of a heating temperature of 70° C. to 150° C. and a heating time of 0.3 to 10 minutes.

In the exposure step, light exposure may be carried out via a photomask on which any given pattern has been formed, or a pattern may be directly drawn using an electron beam laser or the like. For example, a predetermined electromagnetic wave is applied to the resist film through a mask on which a circuit pattern is drawn, so that a portion of the resist film, to which the light has been applied, is changed in properties, and the pattern of the mask can be transcribed. At this time, in the portion to which the light has been applied, the main chain of the polymer comprised in the resist film is preferably cut. In the exposed portion, the main chain of the polymer is cut, and the cut polymer is dissolved in a developing solution in the development step as a post step, so that the resist film (resist material) in the exposed portion can be removed. Thus, in the exposed portion, an intermittent portion is formed in the resist film, and in the intermittent portion of the resist film, the substrate 10 is exposed.

Besides, when an electromagnetic wave is applied to the resist film in the exposure step, the wavelength of the electromagnetic wave is not particularly limited, and it is preferably 15 nm or less.

Development Step

The development step is a step of allowing the resist film, after completion of the exposure, to come into contact with a developing solution to form a pattern. The developing method is not particularly limited, and a dipping method, a spin-coating method, etc. can be adopted. In addition, the developing temperature may be room temperature, or can be changed, as appropriate. The developing solution used in the development step is not particularly limited, and a known developing solution can be used. Examples of the developing solution may include: aqueous solutions of aromatic compounds such as xylene, toluene or anisole, esters such as pentyl acetate, hexyl acetate, heptyl acetate, octyl acetate, ethyl acetate, propyl acetate, n-butyl acetate, ethyl lactate, propyl lactate, butyl lactate or γ-butyrolactone, alcohols such as ethanol or isopropanol, ketones such as diethyl ketone, methyl ethyl ketone, methyl isobutyl ketone or cyclohexanone, ethers such as diethylene glycol dimethyl ether, organic acids such as acetic anhydride or acetic acid, and alkali metal hydroxides such as potassium hydroxide or sodium hydroxide; aqueous solutions of quaternary ammonium hydroxide such as tetramethylammonium hydroxide, tetraethylammonium hydroxide or choline; and alkaline aqueous solutions including amine aqueous solutions such as ethanolamine, propylamine or ethylenediamine. In addition, in the development step, these developing solutions can be mixed with one another and can be then used. Furthermore, a surfactant and the like can also be added to these developing solutions. Developing conditions are appropriately selected from a temperature of −70° C. to 50° C. and a developing time of 1 to 300 seconds.

In addition, after completion of the development step, a rinsing step of using a rinsing solution may be established. The rinsing solution is not particularly limited, and a known rinsing solution can be used. For example, xylene, butyl acetate, ethanol, isopropyl alcohol, methyl isobutyl ketone, pure water, etc. can be used. As such a rinsing solution, the aforementioned substances can be used each alone, or in a combination of two or more types. Moreover, a surfactant and the like may be added to such a rinsing solution, and may be then used. Conditions applied in the rinsing step are selected, as appropriate, from a temperature of −70° C. to 50° C. and a rinsing time of 10 to 100 seconds.

Another Step

The pattern forming method of the present invention is a method of forming a pattern on a resist film formed from a resist material, and it may further comprise a step of processing a semiconductor substrate, etc., using the pattern formed on the resist film as a protective film. Such a step is referred to as an etching step. In this case, the etching step is established as a post step of the development step.

Examples of the method of processing a semiconductor substrate in the etching step may include known methods including: reactive ion etching (RIE) such as chemical wet etching (wet development) or chemical dry etching, and physical etching such as sputter etching or ion beam etching. The processing of a semiconductor substrate is preferably carried out by dry etching using gas such as, for example, tetrafluoromethane, perfluorocyclobutane ($C_4F_8$), perfluoropropane ($C_3F_8$), trifluoromethane, carbon monoxide, argon, oxygen, nitrogen, chlorine, sulfur hexafluoride, difluoromethane, nitrogen trifluoride, and chlorine trifluoride.

Pattern Forming Apparatus

The present invention may relate to a pattern forming apparatus comprising an applier which apply a resist material onto a substrate to form a resist film, an introducer which introduce a metal into the resist film, an exposure, and a developer. Although the pattern forming apparatus of the present invention has the above-described units, it may also be an apparatus comprising a combination of units each having a single function. For example, the pattern forming apparatus of the present invention may be an apparatus comprising a single unit consisting of a unit for forming a resist film and a unit for introducing a metal into the resist film, or may also be an apparatus comprising a single unit consisting of a metal introduction step and an exposure step. The present pattern forming apparatus is preferably an apparatus in which these units are connected with one another by a transportation means and are able to perform a series of steps.

The unit for forming a resist film comprises a supply means for supplying a resist material onto a substrate. Examples of the supply means may include a spin coater, a spray coater, a dispenser, and an inkjet coater. Among others, the supply means is preferably a spin coater.

The unit for forming a resist film may further comprise a heating means. Examples of the heating means may include a hot plate and an apparatus for irradiating a laser such as an infrared ray. Besides, when the unit for forming a resist film comprises such a heating means, it can be configured to have the heating means that is positioned adjacent to the supply means. Moreover, a space, in which the substrate can evacuate, has been established between the supply means and the heating means, and the substrate is transported, so that the treatment may be carried out.

The unit for introducing a metal into the resist film comprises a chamber and a means for supplying a metal gas into the chamber. Specifically, a metal gas supply pipe may be connected with the chamber. The chamber is preferably a vacuum chamber, and such a vacuum chamber particularly preferably comprises a vacuum pump. After a resist film has been placed in such a chamber, a metal gas is supplied into the chamber to fill it with the metal gas, so that the metal gas is allowed to come into contact with the resist film and thereby, the metal can be introduced into the resist film. A vessel for storing the metal gas may comprise a heating apparatus, and the metal gas supply pipe may also comprise a heating apparatus.

The chamber may further comprise a means for heating the resist film. For example, a hot plate may be established in the chamber. A heating means such as a hot plate may have been set to be a desired temperature, or the heating means may also be set, such that a metal is introduced while changing the temperature.

As a unit for introducing a metal into the resist film, for example, a spin coater can be used. The unit for introducing a metal into the resist film may be used under the ambient atmosphere, or under an inert gas atmosphere such as nitrogen, or under vacuum. In particular, a highly reactive metal solution can be used under an inert gas atmosphere, and thus, such an inert gas atmosphere is preferable.

The exposure unit comprises an electromagnetic wave irradiation portion. Examples of the electromagnetic wave irradiation portion may include a semiconductor laser, a high-pressure mercury lamp such a g-line or an i-line, an excimer laser such as ArF or KrF, an electron beam, an extreme ultraviolet, and an X-ray. The exposure unit may be, for example, a unit that comprises an optical portion, an electromagnetic wave irradiation portion, or a power supply portion. When a photomask is used in the exposure step, a portion in which the photomask is placed may be established in the exposure unit. In the case of applying an exposure method using a photomask, for example, a process that is referred to as a "stepping exposure" may be adopted. In such a stepping exposure, a substrate having a resist film is transported into the chamber, and an electromagnetic wave is then applied to the substrate from above via a photomask on which a desired pattern has been formed, so that a certain area is exposed to the electromagnetic wave under conditions in which the irradiation amount, time, focus and the like have been optimized. This operation is repeated several times, so that the entire surface of a wafer can be exposed to the electromagnetic wave. Besides, as an exposure method without using a photomask, for example, a method which comprises adjusting the focus, dose amount, and the like, such that the surface of a resist film is irradiated with an electromagnetic wave, and then performing light exposure to any given position, so as to form a desired pattern, can be adopted. Moreover, upon the light exposure, a method called "immersion exposure" can also be adopted. The immersion exposure is a method, which comprises placing water, oil or the like on the resist film, and then applying an electromagnetic wave to the resist film via such water, oil or the like, so as to form a finer pattern.

The development unit preferably comprises a developing solution storage tank, a spin coater, and a developing solution supply pipe. In the development unit, a method which comprises applying, from a developing solution supply pipe, a developing solution onto a resist film after completion of the exposure, then developing the resist film, and then rotating a substrate having the resist film by the spin coater, so as to remove the developing solution, can be adopted. In addition, the development unit may further comprise a rinsing solution storage tank and a rinsing solution pipe. A method, which comprises applying a rinsing solution onto a resist film after the removal of a developing solution, and then rotating a substrate having the resist film by a spin coater to remove the rinsing solution, can also be adopted.

Resist Material

The resist material used in the pattern forming method of the present invention preferably comprises a polymer. Among others, the polymer is preferably a main-chain scission type positive-type resist material (polymer). The main chain of the polymer comprised in the resist material is cut by irradiation with an electron beam, and only the exposed portion is dissolved in a developing solution. Thereby, it becomes possible to form a higher resolution pattern.

According to the pattern forming method of the present invention, a metal is introduced into a resist film formed from the resist material. Hence, the resist material is preferably a resist material for use in introduction of a metal.

The resist material used in the pattern forming method of the present invention preferably comprises a polymer, and the polymer more preferably comprises a unit derived from at least one selected from structures represented by the following formulae (101) to (103). For example, the polymer may comprise a unit derived from the structure represented by the following formula (101), or may comprise a unit derived from the structure represented by the following formula (102), or may comprise a unit derived from the structure represented by the following formula (103). Moreover, the polymer preferably comprises the units derived from the structures represented by the following formulae (101) and (102), or preferably comprises the units derived from the structures represented by the following formulae (101) and (103), or preferably comprises the units derived from the structures represented by the following formulae (102) and (103). Among others, the polymer particularly preferably comprises all of the units derived from the structures represented by the following formulae (101) to (103). It is to be noted that, in the present description, the "unit" means a repeating unit (monomer unit) that constitutes the main chain of the polymer. Besides, when the polymer comprises a unit derived from a sugar derivative, there is also a case where the side chain of a unit derived from a single sugar derivative further comprises a unit derived from a sugar derivative. In this case, a repeating unit (monomer unit) constituting the polymer on the side chain also corresponds to the "unit" in the present description.

[Formula 7]

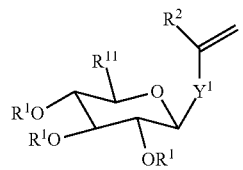

Formula (101)

[Formula 8]

Formula (102)

[Formula 9]

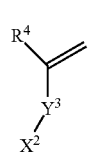

Formula (103)

In the formula (101), $R^1$ each independently represents a hydrogen atom, an alkyl group optionally having a substituent, an acyl group optionally having a substituent, an allyl group optionally having a substituent, an alkoxy group optionally having a substituent, or an alkylsilyl group optionally having a substituent, and a plurality of $R^1$ may be the same or different. $R^{11}$ represents a hydrogen atom or an alkyl group optionally having a substituent. $R^2$ represents a hydrogen atom, an alkyl group, a fluorine atom, a chlorine atom, a bromine atom, or a halogenated alkyl group; and $Y^1$ represents a single bond or a linking group.

In the formula (102). $X^1$ represents an alkyl group optionally having a substituent, an acyl group optionally having a substituent, or an allyl group optionally having a substituent. $R^3$ represents a hydrogen atom, an alkyl group, a fluorine atom, a chlorine atom, a bromine atom, or a halogenated alkyl group; and $Y^2$ represents a single bond or a linking group.

In the formula (103), $X^2$ represents an aryl group optionally having a substituent. $R^4$ represents a hydrogen atom, an alkyl group, a fluorine atom, a chlorine atom, a bromine atom, or a halogenated alkyl group; and $Y^3$ represents a single bond or a linking group.

Among others, the polymer comprised in the resist material preferably comprises the unit derived from the structure represented by the above-described formula (101).

In the formula (101), $R^1$ each independently represents a hydrogen atom, an alkyl group optionally having a substituent, an acyl group optionally having a substituent, an allyl group optionally having a substituent, an alkoxy group optionally having a substituent, or an alkylsilyl group optionally having a substituent. Herein, the alkyl group optionally having a substituent includes a sugar derivative group, and $R^1$ may be a linear or branched sugar derivative-derived unit. The linear or branched sugar derivative-derived unit is preferably a sugar derivative having the same structure as that of a sugar derivative, to which it binds. Besides, when $R^1$ is a linear or branched sugar derivative-derived unit, the number of sugar derivative groups linked (the average polymerization degree of sugar derivatives) is preferably 15 or less, and more preferably 10 or less.

Among others, preferably, $R^1$ each independently represents a hydrogen atom, an alkyl group optionally having a substituent, or an acyl group optionally having a substituent; more preferably, $R^1$ each independently represents a hydrogen atom or an acyl group optionally having a substituent: and further preferably, $R^1$ each independently represents an acyl group optionally having a substituent. When $R^1$ is an acyl group optionally having a substituent, the resolution of the resist material can be more effectively enhanced, and further, the contrast of the resist film can also be enhanced.

When $R^1$ is an alkyl group or an acyl group, the number of carbon atoms contained in the alkyl or acyl group can be selected, as appropriate, depending on purpose. For example, the number of carbon atoms is preferably 1 or more, and is also preferably 200 or less, more preferably 100 or less, further preferably 20 or less, and particularly preferably 4 or less.

Specific examples of $R^1$ include: acyl groups such as an acetyl group, a propanoyl group, a butyryl group, an isobutyryl group, a valeryl group, an isovaleryl group, a pivaloyl group, a hexanoyl group, an octanoyl group, a chloroacetyl group, a trifluoroacetyl group, a cyclopentanecarbonyl group, a cyclohexanecarbonyl group, a benzoyl group, a methoxybenzoyl group, or a chlorobenzoyl group: and alkyl groups such as a methyl group, an ethyl group, an n-propyl group, an n-butyl group, an i-butyl group, or a t-butyl group. Among these groups, $R^1$ is preferably a methyl group, an ethyl group, an acetyl group, a propanoyl group, an n-butyryl group, an isobutyryl group, a benzoyl group, or a trimethylsilyl group, and $R^1$ is particularly preferably an acetyl group or a propanoyl group.

In the formula (101), $R^{11}$ represents a hydrogen atom or an alkyl group optionally having a substituent. When $R^{11}$ represents an alkyl group optionally having a substituent, examples of the alkyl group may include a methyl group, an ethyl group, and a propyl group. Among others, the alkyl group represented by $R^{11}$ is preferably a methyl group, and it is preferable that such an alkyl group further has a substituent. Examples of the substituent possessed by the alkyl group may include a hydroxyl group, an acyl group, an allyl group, and an alkoxy group. Among these, the substituent is preferably a hydroxyl group or an acyl group. More specifically, when $R^{11}$ represents an alkyl group optionally having a substituent, $R^{11}$ is preferably —$CH_2OR^1$, and examples of the $R^1$ may include the aforementioned groups. However, in the formula (101). $R^{11}$ is particularly preferably a hydrogen atom. By using a hydrogen atom as $R^{11}$, it becomes easy to form a finer pattern structure.

In the formula (101), $R^2$ represents a hydrogen atom, an alkyl group, a fluorine atom, a chlorine atom, a bromine atom, or a halogenated alkyl group. Among others, $R^2$ is preferably a hydrogen atom, an alkyl group containing 1 or more and 3 or less carbon atoms, a fluorine atom, a chlorine atom, or a bromine atom, and is particularly preferably a fluorine atom, a chlorine atom, or a bromine atom. By introducing a fluorine atom, a chlorine atom, or a bromine atom into $R^2$, a resist film having a higher contrast can be formed.

In the formula (101). $Y^1$ each independently represents a single bond or a linking group. When $Y^1$ is a linking group, $Y^1$ may be a linking group containing no sugar units. Examples of the linking group may include an alkylene group, a phenylene group, and a group containing —O—, —C(=O)O—, etc. $Y^1$ may also be a linking group formed by combining these groups. Among others, $Y^1$ is preferably a linking group represented by any of the following structural formulae.

[Formula 10]

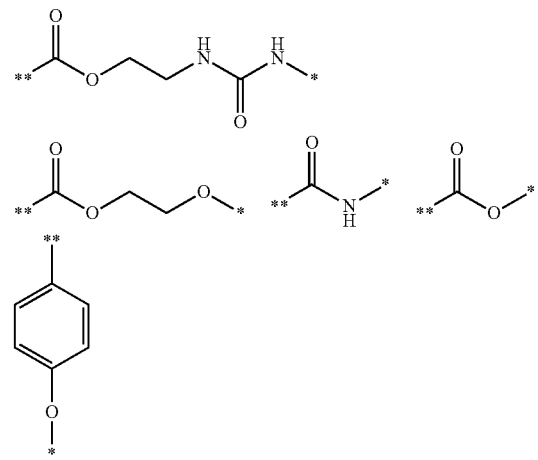

In the above structural formulae, the symbol ** represents a binding site with the main chain side, and the symbol * represents a binding site with the sugar unit on the side chain.

Besides, in the above formula (101), the structure of the sugar derivative is described as a cyclic structure. However, the structure of the sugar derivative may not only be a cyclic structure, but may also be a ring-opened structure (chain structure) called aldose or ketose.

The polymer comprised in the resist material preferably comprises the unit derived from the structure represented by the above-described formula (102), and more preferably comprises the unit derived from the structure represented by the above-described formula (102), in addition to the unit derived from the structure represented by the above-described formula (101).

In the formula (102), $X^1$ represents an alkyl group optionally having a substituent, an acyl group optionally having a substituent, or an allyl group optionally having a substituent, and preferably represents an alkyl group optionally having a substituent. The number of carbon atoms contained in the alkyl group is preferably 1 or more and 8 or less, more preferably 1 or more and 5 or less, and further preferably 1 or more and 3 or less. It is to be noted that the above-described number of carbon atoms means the number of carbon atoms excluding substituents. Examples of the alkyl group having a substituent may include —CH$_2$—OH, —CH$_2$—O-methyl, —CH$_2$—O-ethyl, —CH$_2$—O-n-propyl, —CH$_2$—O-isopropyl, —CH$_2$—O-n-butyl, —CH$_2$—O-isobutyl, —CH$_2$—O-t-butyl, —CH$_2$—O—(C=O)-methyl, —CH$_2$—O—(C=O)-ethyl, —CH$_2$—O—(C=O)-propyl, —CH$_2$—O—(C=O)-isopropyl, —CH$_2$—O—(C=O)-n-butyl, —CH$_2$—O—(C=O)-isobutyl, —CH$_2$—O—(C=O)-t-butyl, —C$_2$H$_4$—OH, —C$_2$H$_4$—O-methyl, —C$_2$H$_4$—O-ethyl, —C$_2$H$_4$—O-n-propyl, —C$_2$H$_4$—O-isopropyl, —C$_2$H$_4$—O-n-butyl, —C$_2$H$_4$—O-isobutyl, —C$_2$H$_4$—O-t-butyl, —C$_2$H$_4$—O—(C=O)-methyl, —C$_2$H$_4$—O—(C=O)-ethyl, —C$_2$H$_4$—O—(C=O)-n-propyl, —C$_2$H$_4$—O—(C=O)-isopropyl, —C$_2$H$_4$—O—(C=O)-n-butyl, —C$_2$H$_4$—O—(C=O)-isobutyl, —C$_2$H$_4$—O—(C=O)-t-butyl, and —C$_2$H$_4$—O—(C=O)—CH$_2$—(C=O)-methyl. In addition, such an alkyl group having a substituent may be a cycloalkyl group, or may also be a crosslinked cyclic cycloalkyl group.

In the formula (102), $R^3$ represents a hydrogen atom, an alkyl group, a fluorine atom, a chlorine atom, a bromine atom, or a halogenated alkyl group. Among others, $R^1$ is preferably a hydrogen atom, an alkyl group containing 1 or more and 3 or less carbon atoms, a fluorine atom, a chlorine atom, or a bromine atom, and is particularly preferably a fluorine atom, a chlorine atom, or a bromine atom. By introducing a fluorine atom, a chlorine atom, or a bromine atom into $R^3$, a resist film having a higher contrast can be formed. Besides, when the polymer comprised in the resist material further comprises the unit derived from the structure represented by the above-described formula (102) in addition to the unit derived from the structure represented by the above-described formula (101), at least either one of the $R^2$ in the formula (101) and $R^3$ in the formula (102) is preferably a fluorine atom, a chlorine atom, or a bromine atom. Otherwise, both of the $R^2$ in the formula (101) and $R^3$ in the formula (102) may be fluorine atoms, chlorine atoms, or bromine atoms.

In the formula (102), $Y^2$ represents a single bond or a linking group. When $Y^2$ is a linking group, examples of the $Y^2$ may include an alkylene group, a phenylene group, and a group containing —O—, —C(=O)O—, etc. $Y^2$ may also be a linking group formed by combining these groups. Among others, $Y^2$ is preferably a linking group represented by any of the following structural formulae.

[Formula 11]

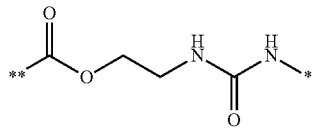

-continued

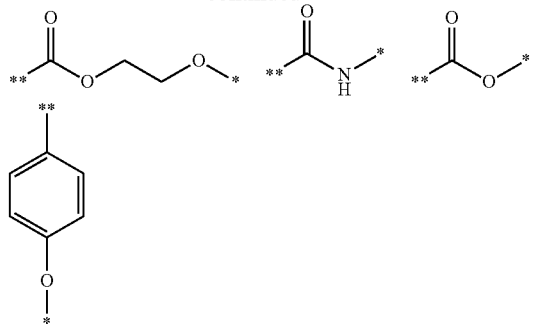

In the above structural formulae, the symbol ** represents a binding site with the main chain side, and the symbol * represents a binding site with $X^1$.

The polymer comprised in the resist material preferably comprises the unit derived from the structure represented by the above-described formula (103), and more preferably, further comprises the unit derived from the structure represented by the above-described formula (103), in addition to the unit derived from the structure represented by the above-described formula (101). Among others, the polymer particularly preferably comprises all of the units derived from the structures represented by the above-described formulae (101) to (103).

Preferably, the polymer comprised in the resist material preferably further comprises the unit derived from the structure represented by the above-described formula (103). By allowing the polymer to further comprise the unit derived from the structure represented by the formula (103), the solubility of the resist material in an organic solvent can be improved.

In the formula (103), $X^2$ represents an aryl group optionally having a substituent. Among others, $X^2$ preferably represents a phenyl group.

In the formula (103), $R^4$ represents a hydrogen atom, an alkyl group, a fluorine atom, a chlorine atom, a bromine atom, or a halogenated alkyl group. Among others, $R^4$ is preferably a hydrogen atom, an alkyl group containing 1 or more and 3 or less carbon atoms, a fluorine atom, a chlorine atom, or a bromine atom, and is particularly preferably a fluorine atom, a chlorine atom, or a bromine atom. By introducing a fluorine atom, a chlorine atom, or a bromine atom into $R^4$, a resist film having a higher contrast can be formed.

In the formulae (101) to (103), at least any one of $R^2$ to $R^4$ is preferably a fluorine atom, a chlorine atom, or a bromine atom.

In the formula (103). $Y^3$ represents a single bond or a linking group. When $Y^3$ is a linking group, examples of the $Y^3$ may include an alkylene group, a phenylene group, and a group containing —O—, —C(=O)O—, etc. $Y^3$ may also be a linking group formed by combining these groups. However, $Y^3$ is particularly preferably a single bond.

The unit derived from the structure represented by the formula (103) is preferably a unit derived from a styrene compound. Examples of the styrene compound may include styrene, o-methylstyrene, p-methylstyrene, ethylstyrene, p-methoxystyrene, p-phenylstyrene, 2,4-dimethylstyrene, p-n-octylstyrene, p-n-decylstyrene, p-n-dodecylstyrene, chlorostyrene, bromostyrene, trimethylsilylstyrene, hydroxystyrene, 3,4,5-methoxystyrene, pentamethyldisilylstyrene, t-butoxycarbonylstyrene, tetrahydropyranylstyrene, phenoxyethylstyrene, and t-butoxycarbonylmethylstyrene.

When the polymer comprises the unit derived from the structure represented by the formula (101), the content percentage (% by mass) of the unit derived from the structure represented by the formula (101) is preferably 1% by mass or more and 95% by mass or less, more preferably 3% by mass or more and 90% by mass or less, further preferably 7% by mass or more and 85% by mass or less, and particularly preferably 12% by mass or more and 80% by mass or less, with respect to the total mass of the polymer. By setting the content percentage of the unit derived from the structure represented by the formula (101) within the above-described range, the contrast of the resist film formed from the resist material can be more effectively enhanced.

The content percentage of the unit derived from the structure represented by the formula (101) can be obtained, for example, from $^1$H-NMR and the weight average molecular weight of the polymer. Specifically, the content percentage can be calculated using the following equation:

Content percentage (% by mass) of the unit derived from the structure represented by the formula (101)=mass of the unit derived from the structure represented by the formula (101)×number of the units (monomers) derived from the structure represented by the formula (101)/weight average molecular weight of the polymer.

When the polymer comprises the unit derived from the structure represented by the formula (102), the content percentage (% by mass) of the unit derived from the structure represented by the formula (102) is preferably 1% by mass or more and 99% by mass or less, more preferably 3% by mass or more and 98% by mass or less, and particularly preferably 12% by mass or more and 97% by mass or less, with respect to the total mass of the polymer. Besides, the content percentage (% by mass) of the unit derived from the structure represented by the formula (102) can be calculated by the same method as the aforementioned calculation of the content percentage of the unit derived from the structure represented by the formula (101).

When the polymer comprises the unit derived from the structure represented by the formula (103), the content percentage (% by mass) of the unit derived from the structure represented by the formula (103) is preferably 1% by mass or more and 99% by mass or less, more preferably 3% by mass or more and 98% by mass or less, and particularly preferably 12% by mass or more and 97% by mass or less, with respect to the total mass of the polymer. It is to be noted that the content percentage (% by mass) of the unit derived from the structure represented by the formula (103) can be calculated by the same method as the aforementioned calculation of the content percentage of the unit derived from the structure represented by the formula (101).

The polymer comprised in the resist material comprises the unit derived from the structure represented by the above-described formula (101), and preferably, further comprises the units derived from the structures represented by the formulae (102) and/or (103). When the polymer comprises the units derived from the structures represented by the formulae (102) and/or (103), the polymer becomes a copolymer. When the polymer is a copolymer, the copolymer may be either a block copolymer or a random copolymer. In addition, the copolymer may have a structure in which a part thereof is a random copolymer and another part thereof is a block copolymer. Thus, a suitable structure can be selected, as appropriate, depending on the intended use or required physical properties.

The polymer may comprise another unit other than the units derived from the structures represented by the above-described formulae (101) to (103). Such another unit is not particularly limited, as long as it is, for example, a unit capable of polymerizing with the structures represented by the above-described formulae (101) to (103).

The content of the polymer is preferably 0.1% by mass or more, and more preferably 0.3% by mass or more, with respect to the total mass of the resist material. On the other hand, the content of the polymer is preferably 40% by mass or less, and more preferably 30% by mass or less, with respect to the total mass of the resist material.

The weight average molecular weight (Mw) of the polymer is preferably 500 or more, more preferably 1000 or more, and further preferably 1500 or more. On the other hand, the weight average molecular weight (Mw) of the polymer is preferably 2,000,000 or less, more preferably 1,500,000 or less, further preferably 1,000,000 or less, and still further preferably 700,000 or less. Besides, the weight average molecular weight (Mw) of the polymer is a value measured relative to polystyrene according to GPC.

The ratio (Mw/Mn) between the weight average molecular weight (Mw) of the polymer and the number average molecular weight (Mn) of the polymer is preferably 1 or more. On the other hand, the Mw/Mn is preferably 100 or less, more preferably 50 or less, further preferably 20 or less, still further preferably 15 or less, and particularly preferably 10 or less.

The solubility of the polymer in at least one selected from PGMEA, PGME, THF, butyl acetate, anisole, cyclohexanone, ethyl lactate, N-methylpyrrolidone, γ-butyrolactone, and DMF is preferably 1% by mass or more, more preferably 2% by mass or more, and particularly preferably 3% by mass or more. The upper limit value of the solubility of the polymer in the above-described organic solvent is not particularly limited, and it can be set to be, for example, 40% by mass. Besides, the above-described solubility means the solubility of the polymer in at least any one selected from PGMEA. PGME, THF, butyl acetate, anisole, cyclohexanone, ethyl lactate, N-methylpyrrolidone, γ-butyrolactone, and DMF.

The method of measuring the solubility of the polymer comprises stirring a predetermined amount of polymer, while gradually adding PGMEA, PGME, THF, butyl acetate, anisole, cyclohexanone, ethyl lactate, N-methylpyrrolidone, γ-butyrolactone or DMF to the polymer, and then recording the amount of the added organic solvent when the polymer is dissolved in the organic solvent. For the stirring, a magnetic stirrer or the like may be used. Then, the solubility is calculated according to the following equation:

Solubility (% by mass)=mass of polymer/(mass of polymer+mass of organic solvent)×100.

Synthesis Method of Polymer

The polymer can be synthesized by a known polymerization method such as living radical polymerization, living anionic polymerization, or atom transfer radical polymerization. For example, in the case of living radical polymerization, a copolymer can be obtained by reacting a monomer with a polymerization initiator such as AIBN(α,α'-azobisisobutyronitrile). In the case of living anionic polymerization, a polymer can be obtained by reacting butyllithium with a monomer in the presence of lithium chloride. In addition, in the Examples described herein, an example of synthesis using living anionic polymerization or living radical polymerization is shown, but the present invention is not limited thereto, and the synthesis can be appropriately performed by the above-described synthesis methods or known synthesis methods.

For example, the method described in International Patent Publication WO99/062964 or the like can be used.

Moreover, upon the synthesis of the polymer, the synthesis may also be combined with a step of extracting a sugar moiety from lignocellulose or the like derived from woody plants or herbaceous plants. For example, when a method of extracting the sugar moiety from lignocellulose or the like derived from woody plants or herbaceous plants is adopted, the extraction method described in JP Patent Publication-A-2012-100546 A, etc. can be utilized.

In the case of xylan, it can be extracted by the method disclosed in, for example, JP Patent Publication-A-2012-180424 A In the case of cellulose, it can be extracted by the method disclosed in, for example, JP Patent Publication-A-2014-148629 A.

Upon the synthesis of a polymer comprising the unit derived from the structure represented by the formula (101), it is preferably that the OH group of the sugar moiety obtained by the above-described extraction method is modified by acetylation, halogenation, etc., and is then used. For example, when an acetyl group is introduced into the sugar moiety, the sugar moiety is allowed to react with acetic anhydride, so that an acetylated sugar moiety can be obtained Upon the synthesis of a copolymer, the copolymer can also be synthesized with reference to Macromolecules Vol. 36, No. 6, 2003. Specifically, each compound is added to a solvent including DMF, water or acetonitrile, and a reducing agent is then added thereto. The reducing agent may be, for example, NaCNBH3. Thereafter, the obtained mixture is stirred at a temperature of 30° C. or higher and 100° C. or lower for 1 or more and 20 or less days, and a reducing agent is appropriately added to the reaction mixture, as necessary. A precipitate is obtained by adding water to the reaction mixture, and a solid is vacuum-dried to obtain a copolymer.

Examples of the method of synthesizing a copolymer include synthetic methods using radical polymerization, RAFT polymerization, ATRP polymerization, click reaction, or NMP polymerization, as well as the above-described method.

The radical polymerization is a polymerization reaction that occurs as a result of addition of an initiator to generate two free radicals by a thermal reaction or a photoreaction. Monomers (e.g., a styrene monomer and a sugar methacrylate compound formed by adding methacrylic acid to the 0-1 position at the terminus of xylooligosaccharide) and an initiator (e.g., an azo compound such as azobisisobutyronitrile (AIBN)) are heated at 150° C., so that a polystyrene-polysaccharide methacrylate random copolymer can be synthesized.

The RAFT polymerization is a radical initiation polymerization reaction involving an exchange chain reaction utilizing a thiocarbonylthio group. For instance, there can be adopted a method comprising converting the OH group attached to position 1 at the terminus of xylooligosaccharide to a thiocarbonylthio group, and then allowing a styrene monomer to react with the resultant at a temperature of 30° C. or higher and 100° C. or lower to synthesize a copolymer (Material Matters, Vol. 5, No. 1, Saishin Kobunshi Gosei (Latest Polymer Synthesis), Sigma-Aldrich Japan).

In the ATRP polymerization, the OH group at the terminus of sugar is halogenated, and thereafter, a metal complex [(CuCl, CuCl2, CuBr, CuBr2, CuI, etc.)+TPMA (tris(2-pyridylmethyl)amine)], MeTREN (tris[2-(dimethylamino) ethyl]amine), etc.), a monomer (e.g., a styrene monomer), and a polymerization initiator (2,2,5-trimethyl-3-(1-phenylethoxy)-4-phenyl-3-azahexane) are allowed to react with the sugar, so that a sugar copolymer (e.g., a sugar-styrene block copolymer) can be synthesized.

In the NMP polymerization, an alkoxy amine derivative used as an initiator is heated, so that it is subjected to a coupling reaction with a monomer molecule so as to generate nitroxide. Thereafter, radicals are generated as a result of thermal dissociation, so that the polymerization reaction progresses. Such an NMP polymerization is one type of living radical polymerization reaction. Monomers (e.g., a styrene monomer and a sugar methacrylate compound formed by adding methacrylic acid to the β-1 position at the terminus of xylooligosaccharide) are mixed, and 2,2,6,6-tetramethylpiperidine 1-oxyl (TEMPO) is used as an initiator. The mixture is heated at 140° C., so that a polystyrene-polysaccharide methacrylate random copolymer can be synthesized.

The click reaction is a 1,3-dipolar azide/alkyne cycloaddition reaction of using sugar having a propargyl group and a Cu catalyst.

Organic Solvent

The resist material of the present invention may further contain an organic solvent. However, the resist material may further contain an aqueous solvent such as water or various aqueous solutions, in addition to the organic solvent. Examples of the organic solvent include an alcohol solvent, an ether solvent, a ketone solvent, a sulfur-containing solvent, an amide solvent, an ester solvent, and a hydrocarbon solvent. These solvents may be used alone or in combination of two or more types.

Examples of an alcohol solvent include: methanol, ethanol, n-propanol, i-propanol, n-butanol, i-butanol, sec-butanol, tert-butanol, n-pentanol, i-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol; ethylene glycol, 1,2-propylene glycol, 1,3-butyleneglycol, 2,4-pentanediol, 2-methyl-2,4-pentanediol, 2,5-hexanediol, 2,4-heptanediol, 2-ethyl-1,3-hexanediol, diethylene glycol, dipropyleneglycol, triethylene glycol, tripropylene glycol, 1H,1H-trifluoroethanol, 1H,1H-pentafluoropropanol, and 6-(perfluoroethyl)hexanol.

In addition, examples of a partially etherified polyhydric alcohol solvent include ethylene glycol monomethyl ether, ethylene glycolmonoethyl ether, ethylene glycol monopropyl ether, ethylene glycolmonobutyl ether, ethylene glycol monohexyl ether, ethylene glycolmonophenyl ether, ethylene glycol mono-2-ethylbutyl ether, diethyleneglycol monomethyl ether, diethylene glycol monoethyl ether, diethyleneglycol monopropyl ether, diethyleneglycol monobutyl ether, diethyleneglycol monohexyl ether, diethylene glycol dimethyl ether, diethylene glycol ethyl methyl ether, propylene glycol monomethyl ether(PGME), propylene glycol monoethyl ether, propylene glycol monopropylether, propylene glycol monobutyl ether, dipropylene glycol monomethylether, dipropylene glycol monoethyl ether, and dipropylene glycolmonopropyl ether.

Examples of an ether solvent include diethyl ether, dipropyl ether, dibutyl ether, diphenyl ether, and tetrahydrofuran (THF).

Examples of a ketone solvent include acetone, methyl ethyl ketone, methyl-n-propyl ketone, methyl-n-butyl ketone, diethyl ketone, methyl-1-butyl ketone, methyl-n-pentyl ketone, ethyl-n-butyl ketone, methyl-n-hexyl ketone, di-i-butyl ketone, trimethylnonanone, cyclopentanone, cyclohexanone, cycloheptanone, cyclooctanone, methylcyclohexanone, 2,4-pentanedione, acetonylacetone, acetophenone, and furfural.

Examples of a sulfur-containing solvent include dimethyl sulfoxide.

Examples of an amide-based solvent include N,N'-dimethylimidazolidinone. N-methylformamide, N,N-dimethylformamide, N,N-diethylformamide, acetamide, N-methylacetamide, N,N-dimethylacetamide, N-methylpropionamide, and N-methylpyrrolidone.

Examples of an ester solvent include diethyl carbonate, propylenecarbonate, methyl acetate, ethyl acetate, .gamma.-butyrolactone, .gamma.-valerolactone, n-propyl acetate, i-propyl acetate, n-butylacetate, i-butyl acetate, sec-butyl acetate, n-pentyl acetate, sec-pentylacetate, 3-methoxybutyl acetate, methylpentyl acetate, 2-ethylbutylacetate, 2-ethylhexyl acetate, benzyl acetate, cyclohexyl acetate, methylcyclohexyl acetate, n-nonyl acetate, methyl acetoacetate, ethylacetoacetate, ethylene glycol monomethyl ether acetate, ethylene glycolmonoethyl ether acetate, diethylene glycol monomethyl ether acetate, diethylene glycol monoethyl ether acetate, diethylene glycol mono-n-butyl ether acetate, propylene glycol monomethyl ether acetate (PGMEA), propylene glycol monoethyl ether acetate, propylene glycol monopropyl ether acetate, propylene glycol monobutyl ether acetate, dipropyleneglycol monomethyl ether acetate, dipropylene glycol monoethyl ether acetate, glycol diacetate, methoxytriglycol acetate, ethyl propionate, n-butyl propionate, i-amyl propionate, methyl 3-methoxy propionate, diethyl oxalate, di-n-butyl oxalate, methyl lactate, ethyl lactate, n-butyl lactate, n-amyl lactate, diethyl malonate, dimethyl phthalate, and diethyl phthalate.

Examples of a hydrocarbon solvent include: aliphatic hydrocarbon solvents such as n-pentane, i-pentane, n-hexane, i-hexane, n-heptane, i-heptane, 2,2,4-trimethyl pentane, n-octane, i-octane, cyclohexane, and methylcyclohexane: and aromatic hydrocarbon solvents such as benzene, toluene, xylene, mesitylene, ethylbenzene, trimethylbenzene, methylethylbenzene, n-propylbenzene, i-propylbenzene, diethylbenzene, i-butylbenzene, triethylbenzene, di-i-propylbenzene, n-amyl naphthalene, and anisole.

Of these, propylene glycol monomethyl ether acetate (PGMEA), N,N-dimethylformamide (DMF), propylene glycol monomethyl ether (PGME), anisole, ethanol, methanol, acetone, methyl ethyl ketone, hexane, tetrahydrofuran (THF), dimethyl sulfoxide (DMSO), 1H,1H-trifluoroethanol, 1H,1H-pentafluoropropanol, 6-(perfluoroethyl)hexanol, ethyl acetate, propyl acetate, butyl acetate, cyclohexanone, furfural, N-methylpyrrolidone, and .gamma.-butyrolactone are preferable, PGMEA, PGME, THF, butyl acetate, anisole, cyclohexanone, N-methylpyrrolidone, .gamma.-butyrolactone, or DMF is more preferable, and PGMEA is even more preferable. These solvents may be used eithersingly or in combination of two or more types.

The content of the organic solvent is preferably 10% by mass or more, more preferably 20% by mass or more, and even more preferably 30% by mass or more with respect to the total mass of the resist material. Moreover, the content of the organic solvent is preferably 99.9% by mass or less, and more preferably 99% by mass or less. By setting the content of the organic solvent within the above range, the coatability of the resist material can be improved.

Optional Components

The resist material of the present invention may comprise optional components as described below.

Monomeric Components

The resist material of the present invention may comprise monomeric components that constitute the polymer, in addition to the polymer. Examples of the monomeric component may include a compound represented by the aforementioned formula (101), and compounds represented by the aforementioned formulae (102) and/or (103).

Crosslinkable Compound

The resist material may further comprise a crosslinkable compound. Because of this crosslinking reaction, the formed resist film becomes strong, and etching resistance can be enhanced.

The crosslinkable compound is not particularly limited, and a crosslinkable compound having at least two crosslink-forming substituents is preferably used. A compound having two or more, for example, 2 to 6 crosslink-forming substituents of at least one type, which are selected from an isocyanate group, an epoxy group, a hydroxymethylamino group, and an alkoxymethylamino group, can be used as a crosslinkable compound. As such a crosslinkable compound, only one type of compound can be used, or a combination of two or more types of compounds can also be used.

These crosslinkable compounds are able to cause a crosslinking reaction due to self-condensation. Moreover, these crosslinkable compounds are also able to cause a crosslinking reaction with constitutional units comprised in the polymer.

Catalyst

To the present resist material, an acid compound, such as p-toluenesulfonic acid, trifluoromethanesulfonic acid, pyridinium-p-toluenesulfonic acid, salicylic acid, sulfosalicylic acid, citric acid, benzoic acid, ammonium dodecylbenzenesulfonate, or hydroxybenzoic acid, can be added as a catalyst for promoting a crosslinking reaction. Examples of the acid compound may include aromatic sulfonic acid compounds such as p-toluenesulfonic acid, pyridinium-p-toluenesulfonic acid, sulfo-salicylic acid, 4-chlorobenzenesulfonic acid, 4-hydroxybenzenesulfonic acid, benzenedisulfonic acid, 1-naphthalenesulfonic acid, or pyridinium-1-naphthalenesulfonic acid. Moreover, as such a catalyst, an acid generator, such as 2,4,4,6-tetrabromocyclohexadienone, benzoin tosylate, 2-nitrobenzyl tosylate, bis(4-tert-butylphenyl)iodonium triuoromethanesulfonate, triphenylsulfonium triuoromethanesulfonate, phenyl-bis(trichloromethyl)-s-triazine, benzoin tosylate, or N-hydroxysuccinimide trifluoromethanesulfonate, can be added.

Light Reflection Preventing Agent

The resist material of the present invention may further contain a light antireflection agent. As a light antireflection agent, for example, a light-absorbing compound can be mentioned. Examples of a light-absorbing compound may include those having high light-absorbing ability in the photosensitive characteristic wavelength region of a photosensitive component in a photoresist provided on the anti-light-reflection film such as a benzophenone compound, a benzotriazole compound, an azo compound, a naphthalene compound, an anthracene compound, an anthraquinone compound, and a triazine compound. Examples of a polymer may include poly ester, polyimide, polystyrene, novola-cresin, polyacetal, and acrylic polymer. Examples of a polymer having a light-absorbing group linked by a chemical bond include a polymer having a light-absorbing aromatic ring structure such as an anthracene ring, anaphthalene ring, a benzene ring, a quinoline ring, a quinoxaline ring, or a thiazole ring.

Other Components

The resist material may further contain anionic liquid, a surfactant, and the like. By incorporating an ionic liquid in the resist material, the compatibility between a resist and an organic solvent can be increased. By including a surfactant in the resist material, the coatability of the resist material on a substrate can be improved. Further, when forming a pattern using the resist material, it is possible to improve coatability of a resist composition or the like applied subsequently to the resist material. Examples of a preferable surfactant include a nonionic surfactant, a fluorine surfactant, and a silicone surfactant. In addition, any known material such as a rheology modifier and an adhesion aid may be included in the resist material.

The content of the optional component as described above is preferably 10% by mass or less, and more preferably 5% by mass or less with respect to the total mass of the resist material.

Resist Film

By applying the aforementioned resist material onto a substrate, a resist film is formed. The resist film is, for example, a film (a protective film) established on a substrate, in order to form a pattern on a substrate such as a silicon wafer. The resist film may be a film established on a substrate, so that it is allowed to directly come into contact with the substrate, or may also be a film laminated on a substrate via another layer. The resist film is processed into a pattern shape desired to be formed on a substrate, and a portion remaining as a pattern shape becomes a protective film in the subsequent etching step. Besides, after a pattern has been formed on a substrate, the resist film (protective film) may be removed from the substrate. Thus, the resist film is used, for example, in a step of forming a pattern on a substrate. Besides, the resist film includes either a layered film before the formation of a pattern, or an intermittent film after the formation of a pattern.

The thickness of the resist film can be adjusted, as appropriate, depending on intended use, and it is, for example, 1 nm or more and 20000 nm or less, more preferably 1 nm or more and 10000 nm or less, further preferably 1 nm or more and 5000 nm or less, and particularly preferably 1 nm or more and 3000 nm or less.

The content percentage of a metal in the resist film, into which the metal has been introduced, is preferably 1 at % or more, more preferably 5 at % or more, further preferably 7 at % or more, and particularly preferably 10 at % or more. The content percentage of the metal can be calculated, for example, by the following method. The resist film after introduction of the metal is subjected to EDX analysis (energy dispersive X-ray spectroscopy) using the electronic microscope JSM7800F (manufactured by JEOL, Ltd.), so as to calculate the ratio of the metal component (the content percentage of the metal), which is defined as the content percentage of the metal.

EXAMPLES

Hereinafter, the features of the present invention will be described more specifically with reference to Examples and Comparative Examples. The materials, used amounts, proportions, treatment content, treatment procedures, and the like shown in the following Examples can be appropriately changed to the extent that such changes do not depart from the spirit of the present invention. Therefore, the scope of the present invention should not be construed as being limited by the following specific examples.

Synthesis of Copolymer 1

Synthesis of acetyl sugar methacrylate 1-methyl chloroacrylate-α-methylstyrene random copolymer 12.2 g of Acetyl sugar methacrylate 1, 4.2 g of methyl 2-chloroacrylate (manufactured by Tokyo Chemical Industry Co., Ltd.) and 3.6 g of α-methylstyrene (manufactured by Tokyo Chemical Industry Co., Ltd.) were mixed into 100 g of THF used as a solvent and 0.8 g of azobis(isobutyronitrile) used as a polymerization initiator azobis(isobutyronitrile) in a flask, and the flask was then hermetically sealed, followed by nitrogen substitution. Under a nitrogen atmosphere, the temperature was increased to 78° C., and the mixture was then stirred for 6.0 hours. Thereafter, the temperature was returned to room temperature, and the inside of the flask was set to ambient atmosphere. To the obtained solution, 300 g of methanol was added dropwise, so as to precipitate a polymer. Thereafter, a solution containing the precipitated polymer was subjected to suction filtration to obtain 11 g of white copolymer 1. Individual constituent units of the obtained copolymer 1 have the following structures.

[Formula 12]

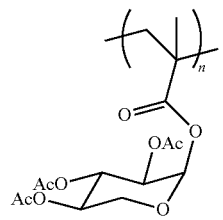

Unit (A)

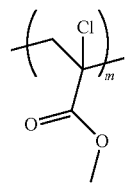

Unit (B)

-continued

Unit (C)

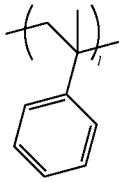

wherein n=91, m=91, and l=78.

Production of Sample for Use in Resist Evaluation

The synthesized copolymer 1 was weighed, and was then dissolved in anisole (manufactured by Tokyo Chemical Industry Co., Ltd.) at 23° C. to result in 3.0% by mass.

Example 1: Te

As a resist solution, ZEP520A (manufactured by ZEON CORPORATION) comprising, as a main component, a copolymer of α-chloromethyl acrylate and methylstyrene was prepared. The resist solution was applied onto a silicon wafer, using a spin-coater, so as to form a resist film having a thickness of 100 nm. Subsequently, the resist film was baked at 180° C. for 1 minute. Thereafter, the silicon wafer was transported into a chamber having a hot plate heated to 150° C., and the pressure was then reduced to 10 Pa. A metal gas (diethyltellurium, manufactured by abcr) was introduced into this chamber to result in 100 Pa, and the chamber was then left at rest for 300 seconds, so that the metal gas was permeated into the resist film. Subsequently, the pressure in the chamber was reduced to 10 Pa, and the metal gas was then removed. After that, water vapor was introduced into the chamber to result in 200 Pa. and the chamber was then left at rest for 300 seconds. Thereafter, the pressure in the chamber was reduced to 10 Pa, and the water vapor was then removed. The inside of the chamber was returned to the atmospheric pressure, and the silicon wafer was then taken out. Subsequently, the electron beam drawing device ELS-F125 (manufactured by ELIONIX INC.) was used as an exposure, an electron beam was applied to the resist film on the silicon wafer under conditions of an acceleration voltage of 50 kV and an electric current of 500 pA (wavelength: 0.0053 nm). The dose amount was set to be 60 μC/cm², 160 μC/cm², or 260 μC/cm², and with regard to each dose amount, 10 repeating patterns each having a groove of 100 nm and a space of 100 nm were prepared. In addition, the dose amount was set to be 60 μC/cm², 160 μC/cm², or 260 μC/cm², and with regard to each dose amount, 10 repeating patterns each having a groove of 30 nm and a space of 30 nm were prepared. After completion of the irradiation with the electron beam, the resist film was transported onto a spin-coater and was then rotated at a rate of 100 rpm, and pentyl acetate (manufactured by Tokyo Chemical Industry Co., Ltd.) with 23° C. was flown thereon for 10 seconds for developing. Thereafter, the resist film was rotated at a rate of 2000 rpm, so that it was dried.

Example 2: Sn

A pattern was formed on the resist film in the same manner as that of Example 1, with the exception that tetramethyltin (manufactured by Merck) was used, instead of diethyltellurium that was used as a metal gas in Example 1.

Example 3: Te, Sugar Material

A pattern was formed on the resist film in the same manner as that of Example 1, with the exception that an anisole solution containing 3% copolymer 1 was used, instead of ZEP520A that that was used as a resist solution in Example 1.

Comparative Example 1

A pattern was formed on the resist film in the same manner as that of Example 1, with the exception that the metal gas was not injected into the chamber in Example 1.

Comparative Example 2

A pattern was formed on the resist film in the same manner as that of Example 1, with the exception that the metal gas was not applied onto the resist film, but was injected into the resist film after completion of the electron beam irradiation (after the exposure step) in Example 1.

Comparative Example 3

A pattern was formed on the resist film in the same manner as that of Example 1, with the exception that the metal gas was not applied onto the resist film, but was injected into the resist film after completion of the developing.

Evaluation

Samples were produced for use in evaluation of resolution, contrast, and aspect ratio, and thereafter, the resolution, the contrast, and the aspect ratio were evaluated as follows. It is to be noted that the dose amount was changed, and that the results of the dose amount providing the best evaluation results were determined to be evaluation results.

Evaluation 1 (Resolution)

The surface and the cross section of a line-and-space portion having a width of 100 nm were observed using the scanning electron microscope (SEM) JSM7800F (manufactured by JEOL Ltd.) under conditions of an acceleration voltage of 5 kV, an emission electric current of 86.0 μA, and a magnification of 100,000-fold, so that the resolution was confirmed. The states were evaluated according to the following evaluation criteria. It is to be noted that a state, in which there was no residue derived from the resist film in the space portion, was evaluated to be a high resolution.
◯: A pattern is formed, and a residue derived from the resist film is not found in the space portion.
x: A pattern cannot be developed, or even if a pattern can be developed, a residue derived from the resist film is found in the space portion.

Evaluation 2 (Contrast)

The resist film before the exposure and the cross section of a line-and-space portion having a width of 100 nm after the development were observed using the scanning electron microscope (SEM) JSM7800F (manufactured by JEOL Ltd.) under conditions of an acceleration voltage of 5 kV, an emission electric current of 86.0 µA, and a magnification of 100,000-fold, and a difference between the heights of resist patterns before and after the development was measured. It is to be noted that a state, in which a change in the resist heights is small, was evaluated that there is a contrast.
◯: (Height of resist film before development)−(height of resist film after development) is within 10 nm.
x: (Height of resist film before development)−(height of resist film after development) is 10 nm or more.

Evaluation 3 (Aspect Ratio)

The surface of a line-and-space portion having a width of 30 nm was observed using the scanning electron microscope (SEM) JSM7800F (manufactured by JEOL Ltd.) under conditions of an acceleration voltage of 5 kV, an emission electric current of 86.0 µA, and a magnification of 100,000-fold, and the state of a pattern was then confirmed at a point in which the aspect ratio theoretically became 3.3 The state of the pattern was evaluated according to the following evaluation criteria. Besides, it has been known that a low aspect ratio causes pattern collapse or a pattern that is not linear, and that, in contrast, a high aspect ratio causes a pattern that becomes linear without pattern collapse. Thus, a state in which a pattern is linear at a theoretical aspect value, was evaluated to be a high aspect ratio.
◯: A pattern is formed and the pattern is linear.
x: A pattern cannot be developed, or even if a pattern can be developed, the pattern is not linear but is meandering or falls and attaches to the adjacent pattern.

Evaluation 4 (Processability)

Using the ICP plasma etching device (manufactured by Tokyo Electron Ltd.), a plasma treatment with a trifluoromethane gas (100 sccm, 1 Pa, 100 W, and 30 seconds) was performed on the space portion of a line-and-space portion having a width of 100 nm, and etching was thereby performed on a silicon substrate, so that processability was evaluated.

With regard to the pattern-formed portion of the silicon substrate after completion of the development and the etching treatment, a cutting section was formed at a right angle to the drawing direction of the line-and-space. This section was observed using the scanning electron microscope (SEM) JSM7800F (manufactured by JEOL Ltd.) under conditions of an acceleration voltage of 1.5 kV, an emission electric current of 37.0 µA, and a magnification of 100,000-fold, and the height of the resist and the processing depth of the silicon substrate were then measured. Thereafter, the value of "processing depth of silicon substrate/(height of resist before processing−height of resist after processing)" was calculated, and when the obtained value was 1.1 or more, the processability was judged to be favorable.
◯: Processing depth of silicon substrate/(height of resist before processing−height of resist after processing)≥1.1
x: Processing depth of silicon substrate/(height of resist before processing−height of resist after processing)<1.1

TABLE 1

|  | Resist material | Metal introduction | Resolution | Contrast | Aspect ratio | Processability |
|---|---|---|---|---|---|---|
| Ex. 1 | ZEP520A | Te | ◯ | ◯ | ◯ | ◯ |
| Ex. 2 | ZEP520A | Sn | ◯ | ◯ | ◯ | ◯ |
| Ex. 3 | Copolymer 1 | Te | ◯ | ◯ | ◯ | ◯ |
| Comp. Ex. 1 | ZEP520A | Non | x | x | x | x |
| Comp. Ex. 2 | ZEP520A | Te (after exposure) | x | x | x | Unevaluable |
| Comp. Ex. 3 | ZEP520A | Te (after development) | x | x | x | ◯ |

In the Examples, the resist films had a high resolution, and the patterns each having a high contrast and a high aspect ratio were formed. In addition, in the Examples, processability was also favorable.

Besides, in Example 1 and Example 3, the thickness of the resist film was changed to 40 nm, the exposure was changed to the EUV scanner NXE3300 manufactured by ASML, and through a photomask on which a pattern had been formed so that a line-and-space pattern with a width of 20 nm could be exposed to light, an EUV light with a wavelength of 13.5 nm was applied to the resist film, so as to form a pattern. The line-and-space portion was observed using the scanning electron microscope (SEM) JSM7800F (manufactured by JEOL Ltd.) under conditions of an acceleration voltage of 5 kV, an emission electric current of 86.0 µA, and a magnification of 100,000-fold. As a result, no resist remained in the space portion in both cases, a change in the heights of the resist was small after completion of the development, and a linear pattern was formed.

On the other hand, in Comparative Example 2, a pattern was not formed at all, and in Comparative Example 3, the resist film had a low resolution, a low contrast, and a low aspect ratio. A portion in which a pattern was formed was selected, and the processability thereof was evaluated. As a result, the processability tended to be favorable. From these results, it was found that it is optimal to perform the metal introduction step before the exposure step, in order to form a favorable pattern.

REFERENCE SIGNS LIST

10 SUBSTRATE
40 RESIST FILM

The invention claimed is:
1. A pattern forming method, comprising:
applying a resist material onto a substrate to form a resist film,
introducing a metal into the resist film,
exposing, and
developing, wherein:
the resist material comprises a polymer, and the polymer comprises a unit derived from structures represented by the following formula (101):

[Formula 1]

Formula (101)

wherein, in the formula (101), $R^1$ each independently represents a hydrogen atom, an alkyl group optionally having a substituent, an acyl group optionally having a substituent, an allyl group optionally having a substituent, an alkoxy group optionally having a substituent, or an alkylsilyl group optionally having a substituent, and a plurality of $R^1$ may be the same or different; $R^{11}$ represents a hydrogen atom or an alkyl group optionally having a substituent; $R^2$ represents a hydrogen atom, an alkyl group, a fluorine atom, a chlorine atom, a bromine atom, or a halogenated alkyl group; and $Y^1$ represents a single bond or a linking group,
the polymer is a main-chain scission type polymer, and
the introducing a metal is established between the applying the resist material and the exposing.

2. The pattern forming method according to claim 1, wherein the polymer further comprises a unit derived from at least one selected from structures represented by the following formulae (102) to (103):

[Formula 2]

Formula (102)

[Formula 3]

Formula (103)

wherein, in the formula (102), $X^1$ represents an alkyl group optionally having a substituent, an acyl group optionally having a substituent, or an allyl group optionally having a substituent; $R^3$ represents a hydrogen atom, an alkyl group, a fluorine atom, a chlorine atom, a bromine atom, or a halogenated alkyl group; and $Y^2$ represents a single bond or a linking group; and
wherein, in the formula (103), $X^2$ represents an aryl group optionally having a substituent; $R^4$ represents a hydrogen atom, an alkyl group, a fluorine atom, a chlorine atom, a bromine atom, or a halogenated alkyl group; and $Y^3$ represents a single bond or a linking group.

3. The pattern forming method according to claim 2, wherein the polymer comprises the units derived from the structures represented by the formulae (101) to (103).

4. The pattern forming method according to claim 2, wherein at least any one of the $R^3$ to $R^4$ is a fluorine atom, a chlorine atom, or a bromine atom.

5. The pattern forming method according to claim 1, wherein the $R^2$ is a fluorine atom, a chlorine atom, or a bromine atom.

6. The pattern forming method according to claim 1, wherein the metal introduction step is a step of introducing at least one selected from the group consisting of Mg, Al, Ag, Ge, Cd, W, Ta, Hf, Zr, Mo, In, Sn, Sb, and Te into the resist film.

7. The pattern forming method according to claim 1, wherein, in the introducing a metal into the resist film, a metal material, in which at least one selected from halogen, an alkyl group, and an aminoalkyl group binds to a metallic element, is used.

8. The pattern forming method according to claim 1, wherein the introducing the metal is performed using a metal gas material that comprises at least one selected from the group consisting of Mg, Al, Ag, Ge, Cd, W, Ta, Hf, Zr, Mo, In, Sn, Sb, and Te.

9. The pattern forming method according to claim 8, wherein the metal gas material is a material in which at least one selected from halogen, an alkyl group, and an aminoalkyl group binds to a metallic element.

10. The pattern forming method according to claim 1, wherein the resist material comprises a polymer comprising a unit derived from at least one selected from structures represented by the following formulae (101) to (103), and wherein the resist material is for use in introduction of a metal:

[Formula 4]

Formula (101)

[Formula 5]

Formula (102)

[Formula 6]

Formula (103)

wherein, in the formula (101), $R^1$ each independently represents a hydrogen atom, an alkyl group optionally having a substituent, an acyl group optionally having a substituent, an allyl group optionally having a substituent, an alkoxy group optionally having a substituent, or an alkylsilyl group optionally having a substituent, and a plurality of $R^1$ may be the same or different; $R^{11}$ represents a hydrogen atom or an alkyl group optionally having a substituent; $R^2$ represents a hydrogen atom, an alkyl group, a fluorine atom, a chlorine atom, a bromine atom, or a halogenated alkyl group; and $Y^1$ represents a single bond or a linking group;

in the formula (102), $X^1$ represents an alkyl group optionally having a substituent, an acyl group optionally having a substituent, or an allyl group optionally having a substituent; $R^3$ represents a hydrogen atom, an alkyl group, a fluorine atom, a chlorine atom, a bromine atom, or a halogenated alkyl group; and $Y^2$ represents a single bond or a linking group; and in the formula (103), $X^2$ represents an aryl group optionally having a substituent; $R^4$ represents a hydrogen atom, an alkyl group, a fluorine atom, a chlorine atom, a bromine atom, or a halogenated alkyl group; and $Y^3$ represents a single bond or a linking group.

11. The pattern forming method according to claim 10, wherein the polymer comprises the units derived from the structures represented by the formulae (101) to (103).

12. The pattern forming method according to claim 11, wherein at least any one of the $R^2$ to $R^4$ is a fluorine atom, a chlorine atom, or a bromine atom.

13. The pattern forming method according to claim 1, performed by a pattern forming apparatus comprising:
- an applier which applies the resist material onto the substrate to form the resist film,
- an introducer which introduces the metal into the resist film,
- an exposure mechanism that performs the exposing, and
- a developer that performs the developing.

\* \* \* \* \*